United States Patent
Zou

(10) Patent No.: US 10,084,097 B2
(45) Date of Patent: Sep. 25, 2018

(54) FLASH MEMORY STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Lu Jun Zou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/889,940

(22) Filed: Feb. 6, 2018

(65) Prior Publication Data
US 2018/0175208 A1  Jun. 21, 2018

Related U.S. Application Data

(62) Division of application No. 15/452,836, filed on Mar. 8, 2017, now Pat. No. 9,923,100.

(30) Foreign Application Priority Data

Mar. 9, 2016 (CN) .......................... 2016 1 0133528

(51) Int. Cl.
*H01L 29/788* (2006.01)
*H01L 29/66* (2006.01)
(Continued)

(52) U.S. Cl.
CPC ...... *H01L 29/7881* (2013.01); *H01L 21/0217* (2013.01); *H01L 21/0228* (2013.01);
(Continued)

(58) Field of Classification Search
CPC .......... H01L 29/66825; H01L 29/7881; H01L 27/11521; H01L 21/02164; H01L 21/0228
(Continued)

(56) References Cited

U.S. PATENT DOCUMENTS 6,380,042 B1  4/2002  Huang
6,573,551 B1  6/2003  Kim et al.
(Continued)

*Primary Examiner* — Theresa T Doan
(74) *Attorney, Agent, or Firm* — Anova Law Group, PLLC

(57) ABSTRACT

A method is provided for fabricating a flash memory structure. The method includes providing a substrate; and forming a gate structure and a hard mask layer. The method also includes forming a sidewall structure on side walls of the gate structure and the hard mask layer; and forming an etching barrier layer covering the sidewall structure. In addition, the method includes forming a first dielectric layer; and removing the sidewall structure and the etching barrier layer higher than the first dielectric layer. Moreover, the method includes forming a sacrificial sidewall layer on the side wall of the hard mask layer and above the sidewall structure and the etching barrier layer; and forming a second dielectric layer on the first dielectric layer. Further, the method includes forming a contact hole penetrating through the second dielectric layer and the first dielectric layer; and forming a contact-hole plug in the contact hole.

8 Claims, 7 Drawing Sheets

(51) Int. Cl.
*H01L 21/02* (2006.01)
*H01L 27/11521* (2017.01)
*H01L 21/768* (2006.01)
*H01L 21/8234* (2006.01)
*H01L 21/8238* (2006.01)
*H01L 21/28* (2006.01)
*H01L 21/311* (2006.01)

(52) U.S. Cl.
CPC .. *H01L 21/02164* (2013.01); *H01L 21/28141* (2013.01); *H01L 21/28273* (2013.01); *H01L 21/31144* (2013.01); *H01L 21/76897* (2013.01); *H01L 21/823468* (2013.01); *H01L 21/823475* (2013.01); *H01L 21/823864* (2013.01); *H01L 21/823871* (2013.01); *H01L 27/11521* (2013.01); *H01L 29/6653* (2013.01); *H01L 29/6656* (2013.01); *H01L 29/66515* (2013.01); *H01L 29/66825* (2013.01); *H01L 29/788* (2013.01)

(58) Field of Classification Search
USPC .......................................................... 257/316
See application file for complete search history.

(56) References Cited

U.S. PATENT DOCUMENTS

| | | |
|---|---|---|
| 6,828,219 B2 | 12/2004 | Yang et al. |
| 6,908,816 B1 | 6/2005 | Thurgate et al. |
| 7,056,828 B2 * | 6/2006 | Chung .............. H01L 21/76829 257/774 |
| 2003/0178688 A1 | 9/2003 | Yang et al. |
| 2010/0006917 A1 | 1/2010 | Masuda |
| 2012/0264286 A1 * | 10/2012 | Yeo ..................... H01L 29/6653 438/595 |

* cited by examiner

US 10,084,097 B2

FLASH MEMORY STRUCTURE

CROSS REFERENCE TO RELATED APPLICATIONS

This application is a divisional of U.S. patent application Ser. No. 15/452,836, filed on Mar. 8, 2017, which claims the priority of Chinese patent application No. 201610133528.5, filed on Mar. 9, 2016, the entirety of all of which is incorporated herein by reference.

FIELD OF THE INVENTION

The present invention generally relates to the field of semiconductor manufacturing technology and, more particularly, relates to a flash memory structure and fabrication techniques thereof.

BACKGROUND

Currently, flash memory has become the mainstream of non-volatile memory. Depending on the structures, the flash memory can be divided into two types: NOR flash memory and NAND flash memory. The main feature of the flash memory is that it can retain long-term storage information without requiring power. The flash memory has many advantages, such as high integration, fast access speed, and easy to erase and rewrite, etc. Therefore, it has a wide range of applications in many fields such as microcomputer, and automatic control, etc.

A contact-hole process is an indispensable process in semiconductor device manufacturing. A contact-hole plug is an important medium to connect to the device active region and the metal layer in the back end, and finally to connect to external circuit. With gradual reduction in feature dimension, the spacing between the devices becomes smaller and smaller, and it is more difficult for processes interconnecting the devices. Therefore, a self-aligned contact-hole etching process (SAC) has, been developed, which reduces the process limitations of the lithography station when the feature dimension becomes smaller.

However, such contact-hole plug formed by existing techniques often leads to the decrease in electrical properties and reliability of the semiconductor structure. The disclosed device structures and methods are directed to solve one or more problems set forth above and other problems.

BRIEF SUMMARY OF THE DISCLOSURE

One aspect of the present disclosure includes a method for fabricating a flash memory structure. The method includes providing a substrate; and forming a gate structure including a floating gate and a control gate on the substrate, and a hard mask layer on the gate structure. The method also includes forming a sidewall structure on side walls of the gate structure and the hard mask layer; and forming an etching barrier layer covering the sidewall structure. In addition, the method includes forming a first dielectric layer on the substrate, wherein top of the first dielectric layer is higher than top of the floating gate and lower than the top of the hard mask layer; and removing the sidewall structure and the etching barrier layer higher than the first dielectric layer. Moreover, the method includes forming a sacrificial sidewall layer on the side wall of the hard mask layer and above the sidewall structure and the etching barrier layer; and forming a second dielectric layer on the first dielectric layer. Further, the method includes forming a contact hole penetrating, through the second dielectric layer and the first dielectric layer; and forming a contact-hole plug in the contact hole.

Another aspect of the present disclosure includes a flash memory structure. The flash memory structure includes a substrate; and a gate structure formed on the substrate, wherein the gate structure includes a floating gate and a control gate formed on the floating gate. The flash memory structure also includes a hard mask, layer formed on the control gate; and a sidewall structure formed on at least part of side surface of the gate structure, wherein top of the sidewall structure is higher than top of the floating gate and lower than top of the hard mask layer. In addition, the flash memory structure includes an etching barrier layer formed on the sidewall structure; and a sacrificial sidewall layer formed on a side wall of the hard mask layer exposed by the sidewall structure and above the sidewall structure and the etching barrier layer. Moreover, the flash memory structure includes a source region and/or a drain region formed in the substrate at both sides of the gate structure; and a dielectric layer formed on the substrate between the adjacent gate structures, wherein top of the dielectric layer is level with the top of the hard mask layer. Further, the flash memory structure includes a contact-hole plug penetrating through the dielectric layer and connected to the source region and/or the drain region.

Other aspects of the present disclosure can be understood by those skilled in the art light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
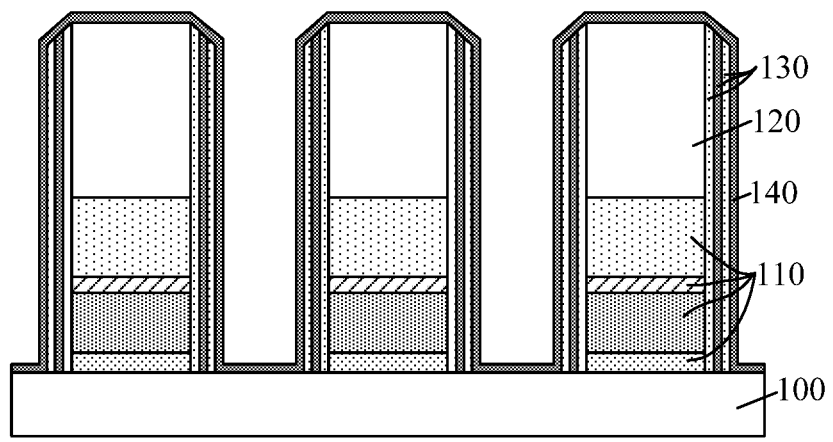
FIGS. 1-3 illustrate flash memory structures corresponding to certain stages of an existing fabrication process of a flash memory structure.
Figure 2:
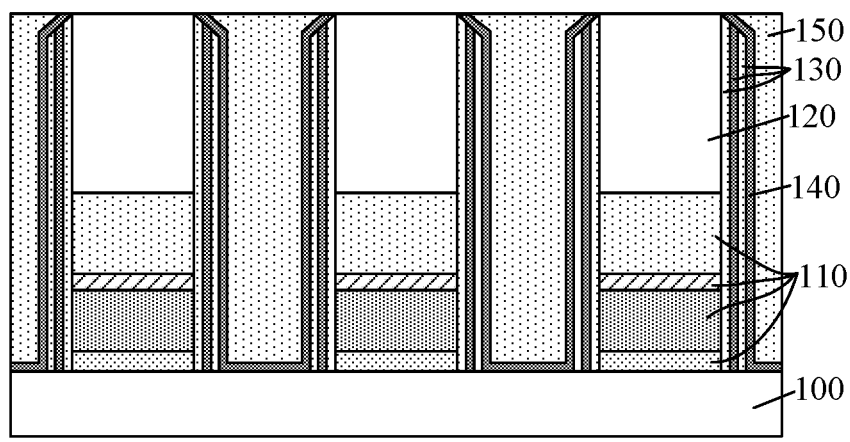
Figure 3:
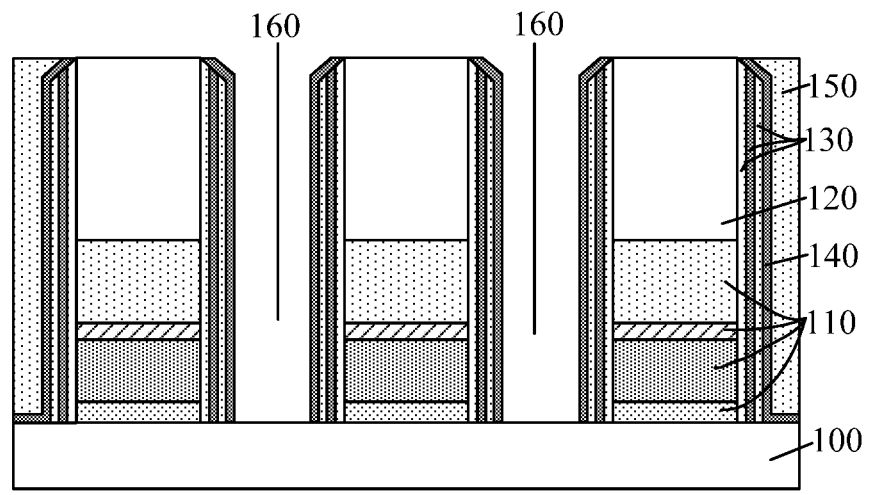

When the NOR flash memory is formed by existing techniques, a contact-hole plug needs to be formed at both sides of a gate structure to connect to a source region and/or a drain region. FIGS. 1-3 illustrate flash memory structures corresponding to certain stages of an existing fabrication process of a flash memory structure. Referring to FIG. 1, the fabrication process includes providing a substrate 100, and forming a gate structure 110 on the substrate 100 and a hard mask layer 120 on top of the gate structure. The hard mask layer 120 is configured as an etching mask for forming the gate structure 110. The fabrication process also includes forming a sidewall structure 130 on side surfaces of the gate structure 110 and the hard mask layer 120. The sidewall structure 130 is configured as a protective layer of the gate structure 110. Further, the fabrication process includes forming an etching barrier layer 140 covering the surface of the substrate 100, the surface of the sidewall structure 130, and the top of the hard mask layer 120. The etching barrier layer 140 is configured as an etching stop layer for a subsequent contact-hole etching process.

The sidewall structure 130 includes a first silicon oxide layer thrilled on the side surfaces of the gate structure 110 and the hard mask layer 120, a silicon nitride layer formed on the first silicon oxide layer, and a second silicon oxide layer formed on the silicon nitride layer. The etching barrier layer 140 is made of silicon nitride.

As shown in FIG. 2, the fabrication process includes forming a dielectric layer 150 on the substrate 100 between the adjacent gate structures 110. The top of the dielectric layer 150 is level with the top of the hard mask layer 120 and the top of the hard nook layer 120 is exposed.

The dielectric layer 150 provides a platform for subsequently forming a contact hole, and achieves electrical isolation for subsequently formed metal layers. The dielectric layer 150 is made of silicon oxide.

As shown in FIG. 3, the fabrication process includes forming a patterned layer (not labeled) on part of surface of the dielectric layer 150. The patterned layer exposes the surface of the dielectric layer 150 in the contact-hole position. The fabrication process also includes using the patterned layer as a mask, a self-aligned etching process is performed to etch the dielectric layer 150 until the surface of the substrate 100 is exposed to form a contact hole 160 in the dielectric layer 150.

When the self-aligned etching process is performed, the patterned layer also exposes the etching barrier layer 140 at both sides of the contact hole. If the thickness of the etching barrier layer 140 is small, when the dielectric layer 150 is etched, the etching barrier layer 140 on the top of the sidewall structure 130 can also be easily etched and removed. It causes the silicon oxide material of the sidewall structure 130 to be exposed to an etching environment for forming the contact hole 160. Since the dielectric layer 150 is made of silicon oxide, the etching selectivity of the etching process to the silicon oxide material in the sidewall structure 130 and the silicon oxide material in the dielectric layer 150 is relatively low. That is, the etching rate of the silicon oxide material in the sidewall structure 130 is similar as the etching rate of the silicon oxide material in the dielectric layer 150. Therefore, the etching process easily causes loss of the silicon oxide material in the sidewall structure 130, leading to the decrease in electrical properties and reliability of the semiconductor structure.

Figure 15:
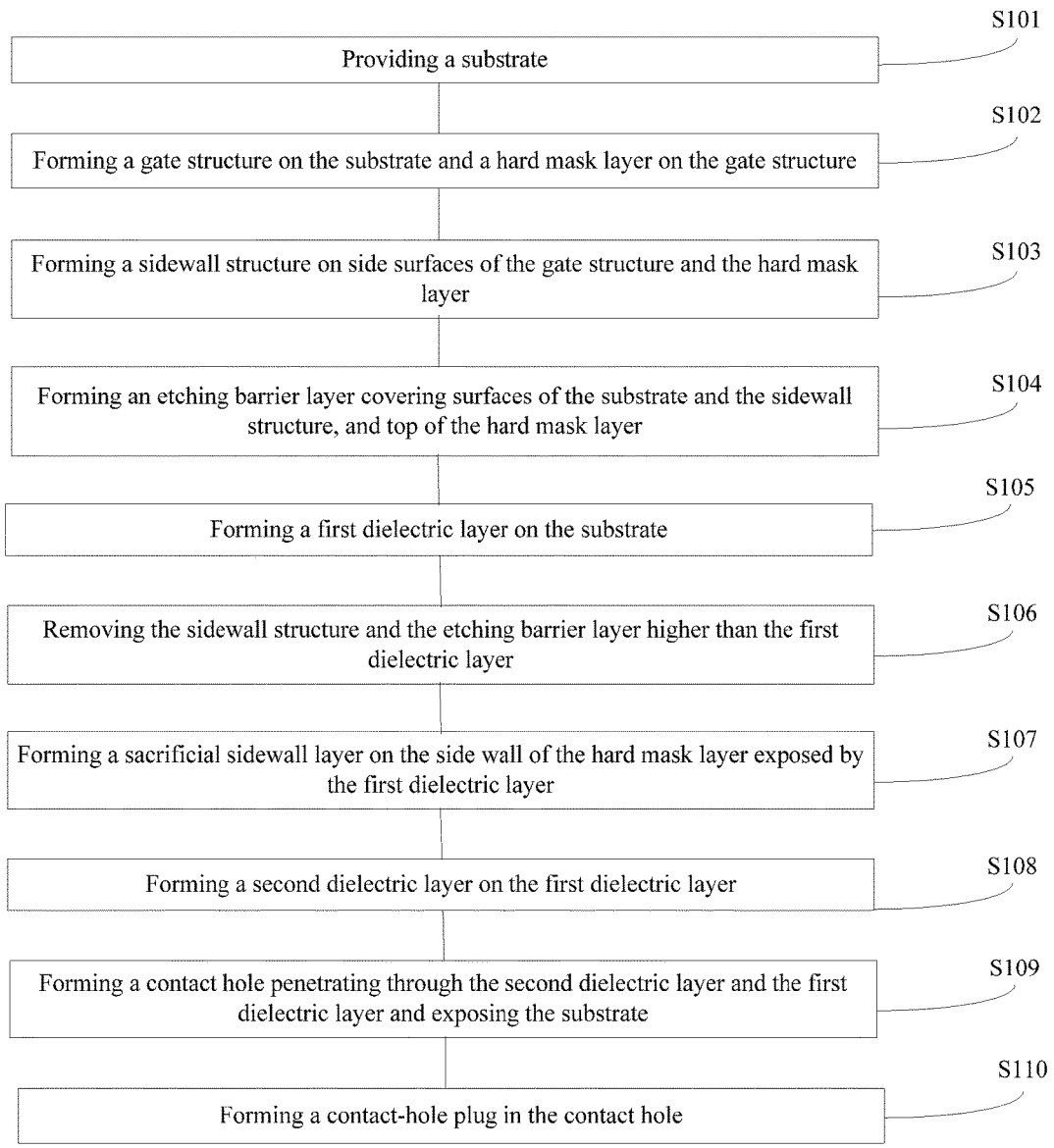
FIG. 15 illustrates an exemplary fabrication process to form a flash memory structure consistent with the disclosed embodiments.

The present disclosure provides an improved flash memory structure and fabrication process. FIG. 15 illustrates an exemplary fabrication process to form a flash memory structure consistent with the disclosed embodiments; and FIGS. 4-13 illustrate flash memory structures corresponding to certain stages of the exemplary fabrication process.

Figure 4:
FIGS. 4-13 illustrate flash memory structures corresponding to certain stages of a fabrication process of a flash memory structure consistent with the disclosed embodiments.

As shown in FIG. 15, at the beginning of the fabrication process, a substrate may be provided (S101). FIG. 4 illustrates a corresponding flash memory structure.

Referring to FIG. 4, a substrate 200 may be, provided. In one embodiment, the substrate 200 may provide a platform for forming the flash memory structure. The substrate 200 may include any appropriate material, such as silicon (Si), germanium (Ge), germanium-silicon alloy (GeSi), silicon carbide (SiC), silicon on insulator (SOI), germanium on insulator (GOI), or gallium arsenide (GaAs) and other III-V compounds thereof. In one embodiment, the substrate 200 may be silicon.

Figure 5:
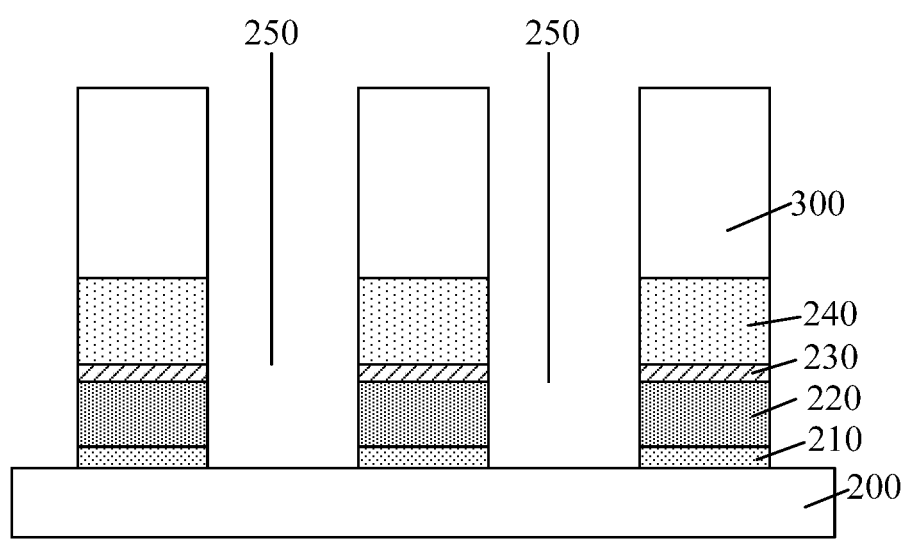

Returning to FIG. 15, after providing the substrate, a gate structure and a hard mask layer may be formed (S102). FIG. 5 illustrates a corresponding flash memory structure.

As shown in FIG. 5, a gate layer may be formed on the substrate 200 and a hard mask layer 300 may be formed on the gate layer. A gate structure may be formed by using the hard mask layer 300 as a mask to etch the gate layer. The gate structure may include a floating gate 220 and a control gate 240 formed on the floating gate 220. In one embodiment, the floating gate 220 and the control gate 240 may be made of polysilicon.

Forming the gate structure may also include: forming a first gate dielectric layer 210 between the substrate 200 and the floating gate 220; and forming a second gate dielectric layer 230 between the floating gate 220 and the control gate 240.

In one embodiment, the first gate dielectric layer 210 may be made of silicon oxide, and the second gate dielectric layer 230 may be made of a stacked structure of silicon oxide layer-silicon nitride layer-silicon oxide layer (ONO, Oxide-Nitride-Oxide).

Specifically, forming the gate structure may include sequentially forming a first gate dielectric film (not labeled), a floating gate film (not labeled), a second gate dielectric film (not labeled), and a control gate film (not labeled) on the substrate 200; and forming the patterned hard mask layer 300 on the control gate film. The patterned hard mask layer 300 may define the pattern of the gate structure. Forming the gate structure may also include using the patterned hard mask layer 300 as a mask to sequentially etch the control gate film, the second gate dielectric far the floating gate film, and the first gate dielectric film until the surface of the substrate 200 is exposed to form the first gate dielectric layer 210 on the substrate 200, the floating gate 220 on the first gate dielectric layer 210, the second gate dielectric layer 2:30 on the floating gate 220, and the control gate 240 on the second gate dielectric layer 230. Further, forming the gate structure may include forming an opening 250 in the hard mask layer 300, the control gate film, the second gate dielectric film, the floating gate film, and the first gate dielectric film. The opening 250 may expose the surface of the substrate 200.

After forming the opening 250, the hard mask layer 300 formed on the top of the control gate 240 may be retained. The hard mask layer 300 may be configured as a stop layer in a subsequent planarization process. In addition, the hard mask layer 300 may also be configured to protect the top of the control gate 240.

The hard mask layer 300 may be made of silicon nitride, silicon oxide, silicon oxynitride, silicon carbide, silicon oxycarbide, or silicon carbonitride oxide, etc. In one embodiment, the hard mask layer 300 may be made of silicon nitride.

In certain embodiments, forming the gate structure may include sequentially forming a first gate dielectric film, a floating gate film, a second gate dielectric film, and a control gate film on the substrate; forming an initial hard mask film on the control gate film; and forming a patterned layer on the initial hard mask film. The patterned layer may define the pattern of the gate structure. Forming the gate structure may also include using the patterned layer as a mask to sequentially etch the initial hard mask film, the control gate film, the second gate dielectric film, the floating gate film, and the first gate dielectric film until the surface of the substrate is exposed to form the first gate dielectric layer on the substrate, the floating gate on the first gate dielectric layer, the second gate dielectric layer on the floating gate, the control gate on the second gate dielectric layer, and the patterned hard mask layer on the control gate. Further, forming the gate structure may include forming an opening in the initial hard mask film, the control gate film, the second, gate dielectric film, the floating gate film, and the first gate dielectric film; and removing the patterned layer. The opening may expose the surface of the substrate.

Figure 6:
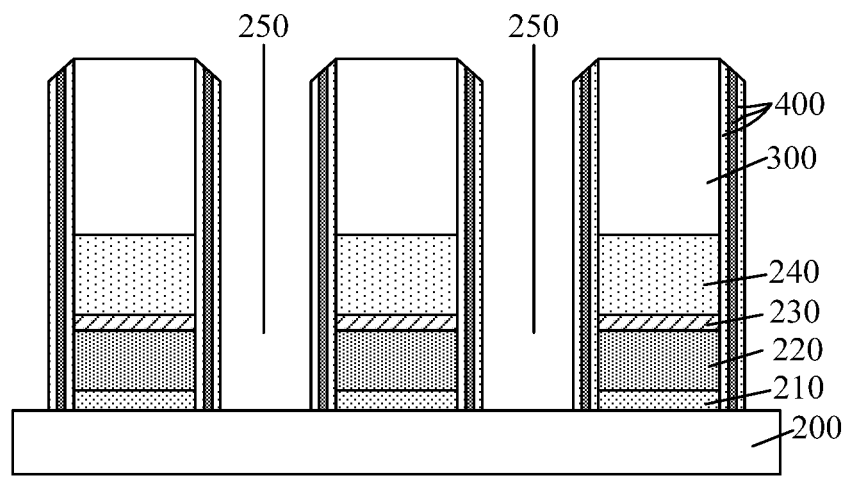

Returning to FIG. 15, after forming the gate structure and the hard mask layer, a sidewall structure may be formed (S103). FIG. 6 illustrates a corresponding flash memory structure.

As shown in FIG. 6, a sidewall structure 400 may be formed on side surfaces of the gate structure and the hard mask layer 300. The sidewall structure 400 may be configured as a protective laser of the gate structure.

In one embodiment, forming the sidewall structure 400 may include: forming a first silicon oxide layer on side surfaces of the gate structure and the hard mask layer 300 forming a silicon nitride layer on the first silicon oxide layer; and forming a second silicon oxide layer on the silicon nitride layer.

Specifically, forming the sidewall structure 400 may include forming a sidewall film protecting and covering the surface of the substrate 200, the side surface of the gate structure, and the side and top surfaces of the hard mask layer 300. Forming the sidewall structure 400 may also include forming the sidewall structure 400 on the side surfaces of the gate structure and the hard mask layer 300 by using a maskless etching process to remove the sidewall film formed on the surface of the substrate and the top surface of the hard mask layer 30.

In one embodiment, the maskless etching process may be a plasma dry etching process. The thickness of the sidewall structure 400 may be in a range of approximately 50-500 Å.

After forming the sidewall structure 400, the fabrication method may also include forming a source region and/or a drain region in the substrate 200 at both sides of the gate structure. The source region and/or the drain region in the substrate 200 between the adjacent gate structures are shared by the two gate structures of the flash memory structures.

Figure 7:
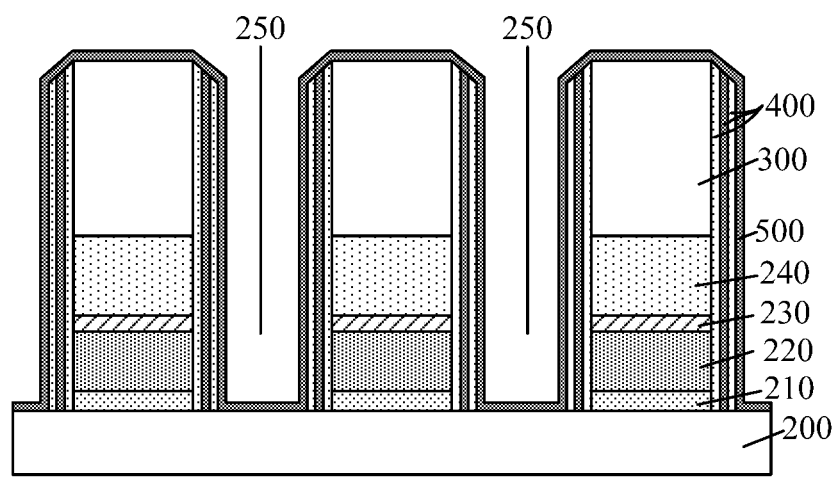

Returning to FIG. 15, after forming the sidewall structure, an etching barrier layer may be formed (S104). FIG. 7 illustrates a corresponding flash memory structure.

As shown in FIG. 7, an etching barrier layer 500 may be formed, covering the surface of the substrate 200, the surface of the sidewall structure 400, and the top of the hard mask layer 300. The etching barrier layer 500 may be configured as an etching stop layer for a subsequent contact-hole etching process. A process of forming, the etching barrier layer 500 may be an atomic layer deposition process, or a furnace tube process, etc. In one embodiment, the etching barrier layer 500 may be formed by the furnace tube process.

The thickness of the etching barrier layer 500 cannot be too thick nor too small. Because the dimensions of the opening 250 may be relatively small, in other words, the process window of forming the etching barrier layer 500 may be relatively small. The thickness of the etching barrier layer 500 cannot be too thick, such that the etching barrier layer 500 may be well formed on the surface of the sidewall structure 400 in the opening 250 and may not have hole-defects in the opening 250. In addition, the thick etching barrier layer 500 may easily cause the dimensions of a subsequently formed contact hole to be reduced, thus affecting the quality of a subsequently formed contact-hole plug. Moreover, the thickness of the etching barrier layer 500 may be related to the thickness of a subsequently formed sacrificial sidewall layer on the top surfaces of the sidewall structure 400 and the etching barrier layer 500.

When the thickness of the etching barrier layer 500 is too small, the thickness of the subsequently formed sacrificial sidewall layer may be too small, such that the sacrificial sidewall layer cannot effectively protect the sidewall structure 400. During the subsequent contact-hole etching process, the sacrificial sidewall layer formed on the top of the sidewall structure 400 can be easily etched and removed, causing the sidewall structure 400 to be exposed to an etching environment. Therefore, in one embodiment, the thickness of the etching barrier layer 500 may be in a range of approximately 10-300 Å.

The etching barrier layer 500 may be made of different materials from a first dielectric layer subsequently formed on the side wall of the etching barrier layer 500 and a second dielectric layer subsequently formed on the first dielectric layer. Therefore, during a subsequent process of forming: the contact hole by etching the first dielectric layer and the second dielectric layer, the etching selectivity of the etching barrier layer 500, and the first dielectric layer and the second dielectric layer may be relatively high. In other words, the etching rate of the etching barrier layer 500 may be smaller than the etching rates of the first dielectric layer and the second dielectric layer. Therefore, it can be ensured that during the process of forming the contact hole, the loss of the etching barrier layer 500 may be less, protecting the sidewall structure 400.

The etching barrier layer 500 may be made of silicon oxynitride, silicon carbide, oxycarbide, or silicon carbonitride oxide, etc. In one embodiment, the etching barrier layer 500 may be made of silicon nitride.

Figure 8:
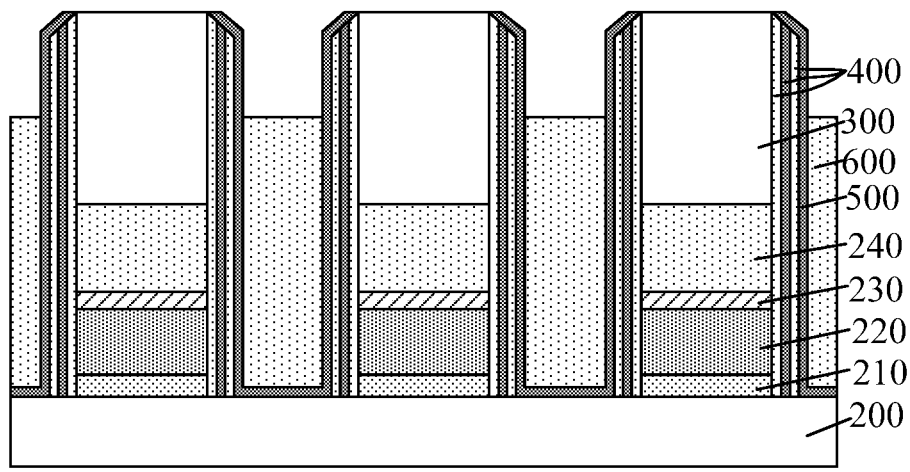

Returning to FIG. 15, after forming the etching barrier layer, a first dielectric layer may be formed (S105). FIG. 8 illustrates a corresponding flash memory structure.

As shown in FIG. 8, a first dielectric layer 600 may be formed on the substrate 200. The top of the first dielectric layer 600 may be higher than the top of the floating gate 220 and lower than the top of the hard mask layer 300. The first dielectric layer 600 may provide a platform for subsequently forming a sacrificial sidewall layer and a contact-hole plug. The first dielectric layer 600 may also provide electrical isolation.

Specifically, forming the first dielectric layer 600 may include forming a first dielectric film. The first dielectric film may also cover the top of the hard mask layer 300. Forming the first dielectric layer 600 may also include removing the first dielectric film higher than the top of the hard mask layer 300 by a polishing process to form a first initial dielectric layer. The top of the first initial dielectric layer may be level with the top of the hard mask layer 300. Further, forming the first dielectric layer 600 may include removing part of thickness of the first initial dielectric layer by a back-etching process to form the first dielectric layer 600. The top of the first dielectric layer 600 may be higher than the top of the floating gate 220 and lower than the top of the hard mask layer 300.

During the polishing process of removing the first dielectric film higher than the top of the hard mask layer 300, the etching barrier layer 500 formed on the top of the hard mask layer 300 may also be removed by the polishing process.

In one embodiment, the top of the first dielectric layer 600 may be higher than the top of the floating gate 220 and lower than the top of the control gate. The first dielectric layer 600 may be made of silicon oxide, silicon nitride, or silicon oxynitride, etc. In one embodiment, the first dielectric layer 600 may be made of silicon oxide.

In one embodiment, the process of forming the first dielectric film may be a chemical vapor deposition process, a plasma enhanced chemical vapor deposition process, or a low pressure chemical vapor deposition process, etc. The polishing process of removing the first dielectric film higher than the top of the hard mask layer 300 may be a chemical mechanical polishing process. The first dielectric layer 600 may be formed by using a wet etching process, a dry etching process, or a hybrid wet etching and dry etching process to back etch the first initial dielectric layer and to remove part of thickness of the first initial dielectric layer.

The sidewall structure 400 and the etching barrier layer 500 higher than the first dielectric layer 600 may need to be subsequently removed. A sacrificial sidewall layer may be formed on the side wall of the hard mask layer 300 exposed by the first dielectric layer 600. To avoid adverse effects on the electrical performance of the flash memory structure, the side wall of the subsequently formed sacrificial sidewall layer cannot be contacted with the floating gate 220. In addition, to avoid large loss of the etching barrier layer 500 during the contact-hole etching process, the height of the subsequently formed sacrificial sidewall layer cannot be too small. In other words, the height of the first dielectric layer 600 cannot be too high. Therefore, in one embodiment, the top of the first dielectric layer 600 may be at least higher than the top of the floating gate 220. In other words, the first dielectric layer 600 may cover at least the side surface of the floating gate 220. In one embodiment, the thickness of the hard mask layer 300 exposed by the first dielectric layer 600 may be half of the total thickness of the hard mask layer 300.

Figure 9:
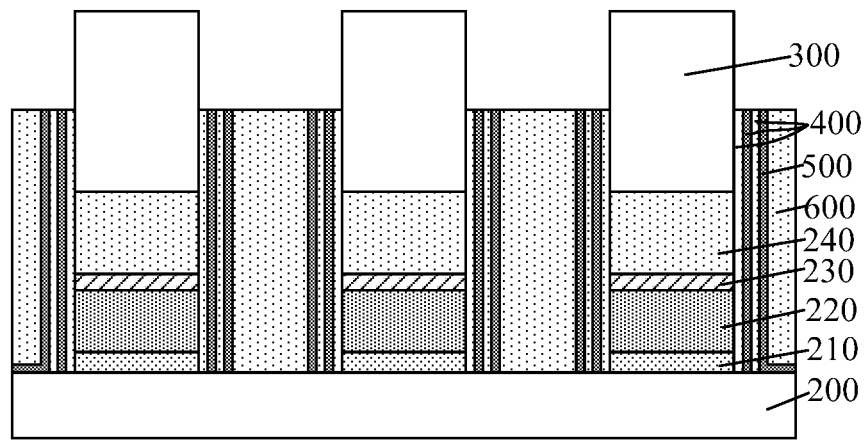

Returning to FIG. 15, after forming the first dielectric layer, the sidewall structure and the etching barrier layer higher than the first dielectric layer may be removed (S106). FIG. 9 illustrates a corresponding flash memory structure.

As shown in FIG. 9, the sidewall structure 400 and the etching barrier laser 500 higher than the first dielectric layer 600 may be removed.

By removing the sidewall structure 400 and the etching barrier layer 500 higher than the first dielectric layer 600, a spatial location may be provided for subsequently forming the sacrificial sidewall layer on the side wall of the hard mask layer 300 exposed by the first dielectric layer 600.

The process of removing the sidewall structure 400 and the etching barrier layer 500 higher than first dielectric layer 600 may be a wet etching process, or a plasma dry etching process, etc. In one embodiment, the wet etching process may be performed to remove the sidewall structure 400 and the etching barrier layer 500 higher than the first dielectric layer 600. The etching solutions used in the wet etching process may be a hydrofluoric acid solution and a phosphoric acid solution.

Figure 10:
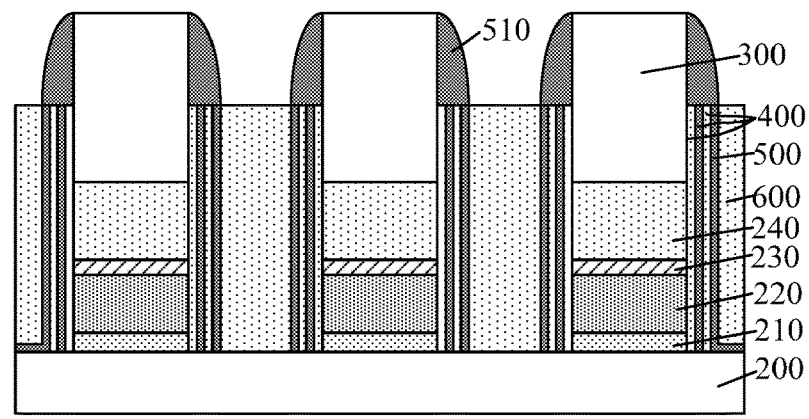

Returning to FIG. 15, after removing the sidewall structure the etching barrier layer higher than the first dielectric layer, a sacrificial sidewall layer may be formed (S107). FIG. 10 illustrates a corresponding flash memory structure.

As shown in FIG. 10, a sacrificial sidewall layer 510 may be formed on the side wall of the hard, mask layer 300 exposed by the first dielectric layer 600. The sacrificial sidewall layer may be formed on the top surfaces of the sidewall structure 400 and the etching barrier layer 500.

The sacrificial sidewall layer 510 may be configured as an etching mask during the subsequent process of firming the contact hole. The sacrificial sidewall layer 510 may also protect the sidewall structure 400 during the process of forming the contact hole.

Specifically, fuming the sacrificial sidewall layer 510 may include forming a sacrificial sidewall film covering the surface of the first dielectric layer 600, the top and side surfaces of the hard mask layer 300 exposed by the first dielectric layer 600. Forming the sacrificial sidewall layer 510 may also include using a maskless etching process to remove the sacrificial sidewall film firmed on the surface of the first dielectric layer 600 and the top of the hard mask layer 300 to form the sacrificial sidewall layer 510 on the side wall of the hard mask layer 300 exposed by the first dielectric layer 600.

The process of forming the sacrificial sidewall film may be a furnace tube process, or an atomic layer deposition process, etc. In one embodiment, the sacrificial sidewall film may be formed by the furnace tube process.

The parameters of the furnace tube process should be set within a reasonable range to ensure that the sacrificial sidewall film meets the requirements of thickness and quality and to avoid wasting time. Specifically, the parameters of the furnace tube process may include: the pressure may be in a range of approximately 1 mTorr-5 Torr the process temperature may be in a range of approximately 200-800° C.; the gases into the furnace tube may be dichlorosilane and ammonia; the gas flow rate may be in a range of approximately 1-1000 sccm; and the process time may be in a range of approximately 0.1-5 hours.

The sacrificial sidewall layer 510 may be made of different materials from the first dielectric layer 600 and a second dielectric layer subsequently formed on the side wall of the sacrificial sidewall layer 510. Therefore, during a subsequent process of forming the contact hole by etching the first dielectric layer 600 and the second dielectric layer, the etching selectivity of the sacrificial sidewall layer 510, and the first dielectric layer 600 and the second dielectric layer may be high. In other words, the etching rate of the sacrificial sidewall layer 510 may be smaller than the etching rate of the first dielectric layer 600 and the second dielectric layer. Therefore, it can be ensured that during the process of forming the contact hole, the loss of the sacrificial sidewall layer 510 may be significantly less, and the sacrificial sidewall layer 510 may protect the side wall structure 400.

The sacrificial sidewall layer 510 may be made of silicon carbide, silicon nitride, or silicon oxynitride, etc. In one embodiment, the sacrificial sidewall layer 510 may be made of silicon nitride.

Furthermore, the thickness of the sacrificial sidewall layer 510 cannot be too thick nor too small. Because the dimensions of the opening 250 may be relatively small, the process window of forming the sacrificial sidewall layer 510 may be relatively small. The thickness of the sacrificial sidewall layer 510 cannot be too thick, such that the sacrificial sidewall layer 510 may be well formed on the side wall of the hard mask layer 300 in the opening 250 and may not have hole-defects in the opening 250.

In addition, the thick sacrificial sidewall layer 510 may easily cause the dimensions of the subsequently formed contact hole to be reduced, thus impacting the quality of the subsequently formed contact-hole plug. If the thickness of the sacrificial sidewall layer 510 is too small, the sacrificial sidewall layer 510 may be easily depleted in the subsequent etching process of forming the contact hole. It may cause the sidewall structure 400 to be exposed to an etching environment, and further cause the silicon oxide material of the sidewall structure 400 to be subjected to loss in the process of etching the first dielectric layer 600 and the second dielectric layer. Therefore, in one embodiment, the thickness of the sacrificial sidewall layer 510 may be in a range of approximately 50-500 Å.

Figure 11:
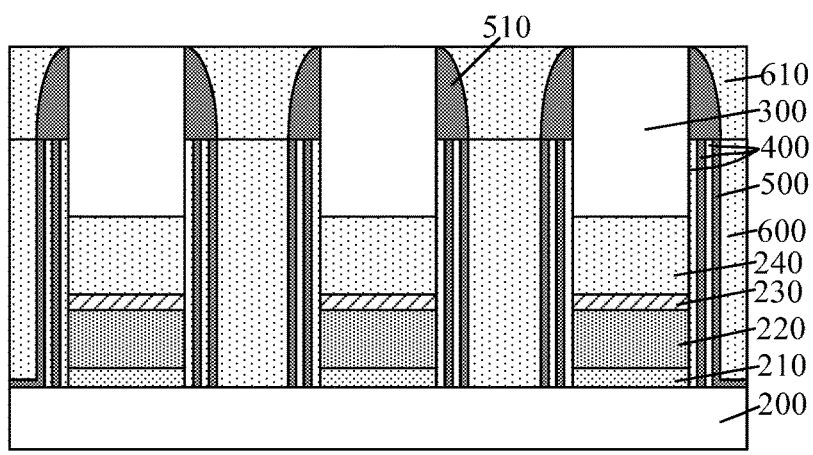

Returning to FIG. 15, after forming the sacrificial sidewall layer, a second dielectric layer may be formed (S108). FIG. 11 illustrates a corresponding flash memory structure.

As shown in FIG. 11, a second dielectric layer 610 may be formed on the first dielectric layer 600. The second dielectric layer 610 may provide a platform for subsequently forming the contact-hole plug. The second dielectric layer 610 may also provide electrical isolation. In one embodiment, the second dielectric layer 610 may be level with the top of the hard mask layer 300, and the top of the hard mask layer 300 may be exposed.

Specifically, forming the second dielectric layer 610 may include forming a second dielectric film on the first dielectric layer 600. The second dielectric film may cover the top of the hard mask layer 300. Forming the second dielectric layer 610 may also include removing the second dielectric film higher than the top of the hard mask layer 300 by a polishing process to form the second dielectric layer 610.

During, a subsequent process of forming the contact hole, to ensure the etching rate of the second dielectric layer 610 and the etching rate of the first dielectric layer 600 are consistent, in one embodiment, the second dielectric layer 610 and the first dielectric layer 600 may be made of a same material.

The second dielectric layer 610 may be made of silicon oxide, silicon nitride, or silicon oxynitride, etc. In one embodiment, the first dielectric layer 600 may be made of silicon oxide. Correspondingly, the second dielectric layer 610 may also be made of silicon oxide.

In one embodiment, a process of forming the second dielectric film on the first dielectric layer 600 may be a chemical vapor deposition process, a plasma enhanced chemical vapor deposition process, or a low pressure chemical vapor deposition process, etc. The polishing process of removing the second dielectric film higher than the top of the hard mask layer 300 may be a chemical mechanical polishing process.

Figure 12:
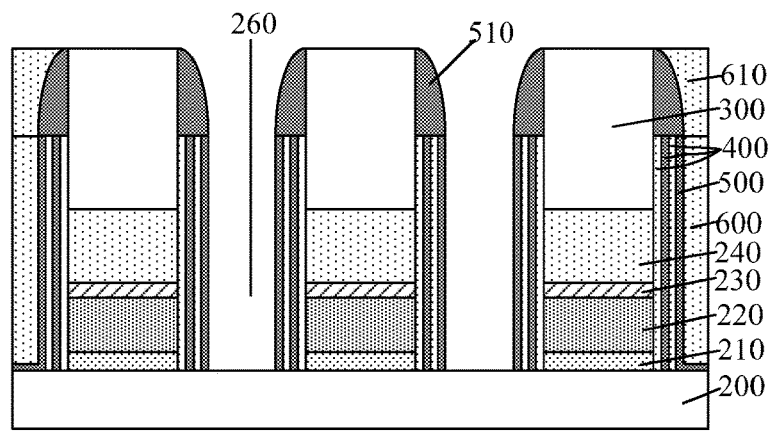

Returning to FIG. 15, after forming the second dielectric layer, a contact hole may be formed (S109). FIG. 12 illustrates a corresponding flash memory structure.

As shown in FIG. 11, a contact hole 260 may be formed by using the sacrificial sidewall layer 510 as a mask to etch the second dielectric layer 610 and the first dielectric layer 600. The contact hole 260 may penetrate through the second dielectric layer 610 and the first dielectric layer 600 and the surface of the substrate 200 may be exposed. During the etching process of forming the contact hole 260, the etching rate of the second dielectric layer 610 and the first dielectric layer 600 may be larger than the etching rate of the sacrificial sidewall layer 510. The contact hole 260 may provide a spatial location for subsequently forming a contact-hole plan.

Specifically, forming the contact hole 260 may include forming a photoresist layer on the second dielectric layer 610 (not labeled). The photoresist layer may expose the top surface of the second dielectric layer 610 in the contact-hole position. Forming the contact hole 260 may also include using the photoresist layer as a mask to sequentially etch the second dielectric layer 610 and the first dielectric layer 600 until the substrate 200 is exposed to form the contact hole 260 penetrating through the second dielectric layer 610 and the first dielectric layer 600.

In one embodiment, a plasma dry etching process may be performed to etch the second dielectric layer 610 and the first dielectric layer 600. Specifically, the plasma dry etching process may be a self-aligned etching process. Correspondingly, the sacrificial sidewall layer 510 at both sides of the contact hole may also be exposed by the photoresist layer. During the process of etching, the second dielectric layer 610 and the first dielectric layer 600, the sacrificial sidewall layer 510 may also be configured as an etching mask.

A source region and/or a drain region may be formed in the substrate 200 at both sides of the gate structure. Correspondingly, the source region and/or the drain region may be exposed by the contact hole 260.

Figure 13:
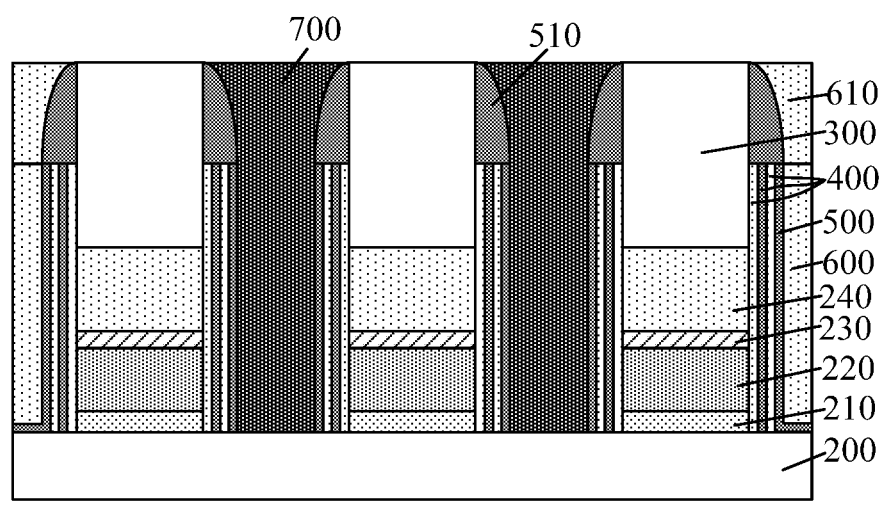

Returning to FIG. 15, after forming the contact hole, a contact-hole plug may be formed (S110) FIG. 13 illustrates a corresponding flash memory structure.

As shown in FIG. 13, a contact-hole plug 700 may be formed in the contact hole 260. The contact-hole plug may be configured to connect to the metal interconnect lines to achieve electrical conduction and to form a circuit.

Specifically, forming the contact-hole plug 700 may include forming a conductive material layer filling the contact hole 260. The conductive material layer may also cover the top of the second dielectric layer 610 and the hard mask layer 300. Forming the contact-hole plug 700 may also include planarizing the conductive material layer until the top surfaces of the second dielectric layer 610 and the hard mask layer 300 are exposed to form the contact-hole plug 700 in the contact hole 260.

The contact-hole plug 700 may be made of W, Al, Cu, Ag, or Au, etc. In one embodiment, the contact-hole plug 700 may be made of W. A chemical vapor deposition process, a sputtering process, or a plating process may be performed to fill the contact hole 260 with the conductive material layer. A chemical mechanical polishing process may be performed to planarize the conductive material layer.

The source region and/or the drain region may be exposed by the contact hole 260. Correspondingly, the contact-hole plug 700 may be contacted with the source region and/or the drain region, thus achieving electrical conduction and forming a circuit.

During the etching process of forming the contact hole 260 (shown in FIG. 12), the etching rate of the second dielectric layer 610 and the first dielectric layer 600 may be larger than the etching rate of the sacrificial sidewall layer 510. Therefore, during the etching process of forming the contact hole 260, the loss of the sacrificial sidewall layer 510 may be relatively small. It may protect the sidewall structure 400, avoid the loss of the silicon oxide layer in the top of the sidewall structure 400 caused by the etching process, and improve the electrical properties and reliability of the semiconductor structure.

In addition, the sacrificial sidewall layer 510 may have little impact on the electrical properties and reliability of the semiconductor structure, and have desired process compatibility.

Figure 14:
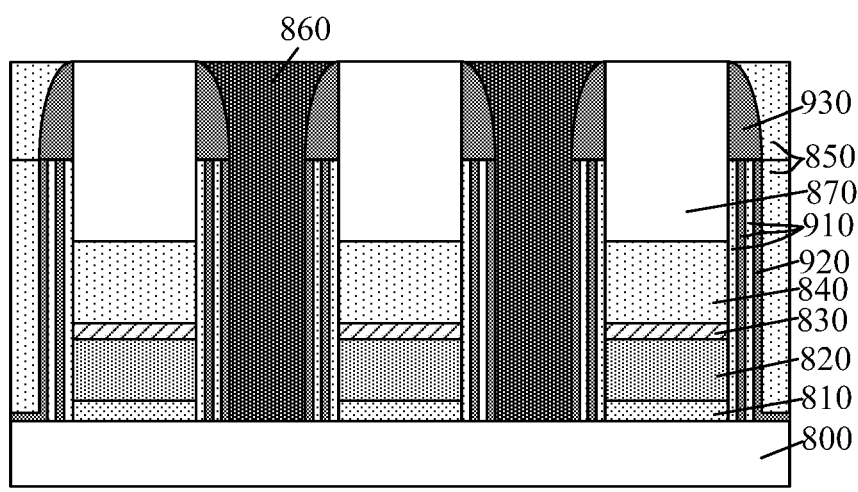
FIG. 14 illustrates a flash memory structure consistent with the disclosed embodiments.

Correspondingly, a flash memory structure is also provided. FIG. 14 illustrates an exemplary flash memory structure.

As shown in FIG. 14, the flash memory structure may include a substrate 800 and a gate structure formed on the substrate 800. The gate structure may include a floating gate 820 and a control gate 840 formed on the floating gate 820. The flash memory structure may also include a hard mask layer 870 formed on the control gate 840 and a sidewall structure 910 formed on at least part of side surface of the gate structure. The top of the sidewall structure 910 may be higher than the top of the floating gate 820 and lower than the top of the hard mask layer 870. Moreover, the flash memory structure may include an etching barrier layer 920 formed on the side surface of the sidewall structure 910 and a sacrificial sidewall layer 930 formed on the side wall of the hard mask layer 870 exposed by the sidewall structure 910. The sacrificial sidewall layer 930 may also be formed above the sidewall structure 910 and the etching, barrier layer 920. In addition, the flash memory structure may include a source region and/or a drain region (not labeled) formed in the substrate 800 at both sides of the gate structure and a dielectric layer 850 formed on the substrate 800 between the adjacent gate structures. The top of the dielectric layer 850 may be level with the top of the hard mask layer 870. The etching rate of the dielectric layer 850 may be larger than the etching rate of the sacrificial sidewall layer 930. Further, the flash memory structure may include a contact-hole plug 860, penetrating through the dielectric layer 850 and connected to the source region and/or the drain region.

The substrate 800 may include any appropriate material, such as silicon (Si), germanium (Ge), germanium-silicon alloy (GeSi), silicon carbide (SiC), silicon on insulator (SOI), germanium on insulator (GOI), or gallium arsenide (GaAs) and other III-V compounds thereof. In one embodiment, the substrate 800 may be silicon. In one embodiment, the floating gate 820 and the control gate 840 may be made of polysilicon.

The flash memory structure may also include a first gate dielectric layer 810 formed between the substrate 800 and the floating gate 820, and a second gate dielectric layer 830 formed between the floating gate 820 and the control gate 840. In one embodiment, the first gate dielectric layer 810 may be made of silicon oxide, and the second gate dielectric layer 830 may be made of a stacked structure of silicon oxide layer-silicon nitride layer-silicon oxide layer (ONO, Oxide-Nitride-Oxide).

In one embodiment, the thickness of the hard mask layer 870 covered by the sidewall structure 910 may be half of the total thickness of the hard mask layer 870. Correspondingly, the thickness of the hard mask layer 870 covered by the sacrificial sidewall layer 930 may be half of the total thickness of the hard mask layer 870.

In certain embodiments, the top of the sidewall structure may be higher than the top of the floating gate and lower than the top of the control gate. Correspondingly, the sacrificial sidewall layer may be formed on the side surface of the control gate exposed by the sidewall structure and the side surface of the hard mask layer.

The hard mask layer 870 may be made of silicon nitride, silicon oxide, silicon oxynitride, silicon carbide, silicon oxycarbide, or silicon carbonitride oxide, etc. In one embodiment, the hard mask layer 870 may be made of silicon nitride.

In one embodiment the sidewall structure 910 may include a first silicon oxide layer, a silicon nitride layer formed on the first silicon oxide layer, and a second silicon oxide layer formed on the silicon nitride layer. The thickness of the sidewall structure 910 may be in a range of approximately 50-500 Å.

The etching barrier layer 920 may be made of silicon oxide, silicon oxynitride, silicon carbide, silicon oxycarbide, or silicon carbon trifle oxide, etc. In one embodiment, the etching barrier layer 920 may be made of silicon nitride.

The thickness of the etching barrier layer 920 cannot be too thick nor too small. Because the spacing between the adjacent gate structures may be relatively small, the thickness of the etching barrier layer 920 cannot be too thick, such that the etching barrier layer 920 may not have hole-defects. In addition, the thick etching barrier layer 920 may easily cause the dimensions of the contact-hole plug 860 to be reduced, thus impacting the conductive performance of the contact-hole plug 860. Moreover, the thickness of the etching barrier layer 920 may be related to the thickness of the sacrificial sidewall layer 930. When the thickness of the etching barrier layer 920 is too small, the thickness of the sacrificial sidewall layer 930 may be too small, such that the sacrificial sidewall layer 930 cannot effectively protect the sidewall structure 910. Therefore, in one embodiment, the thickness of the etching barrier layer 920 may be in a range of approximately 10-300 Å.

The sacrificial sidewall layer 930 may be made of silicon carbide, silicon nitride, or silicon oxynitride, etc. In one embodiment, the sacrificial sidewall layer 930 may be made of silicon nitride.

Further, the thickness of the sacrificial sidewall layer 930 cannot be too thick nor too small. Because the spacing between the adjacent gate structures may be relatively small, the thickness of the sacrificial sidewall layer 930 cannot be too thick, such that the sacrificial sidewall layer 930 may not have hole-defects. In addition, the thick sacrificial sidewall layer 930 may easily cause the dimensions of the contact-hole plug 860 to be reduced, thus impacting the conductive performance of the contact-hole plug 860. When the thickness of the sacrificial sidewall layer 930 is too small, the sacrificial sidewall layer 930 may be easily depleted during the subsequent etching process of forming the contact hole. Such that the protective effect of the sacrificial sidewall layer 930 to the sidewall structure 910 may be reduced, and further causing the silicon oxide material of the sidewall structure 910 to be subjected to loss during the process of forming the contact-hole plug 860. Therefore, in one embodiment, the thickness of the sacrificial sidewall layer 930 may be in a range of approximately 50-500 Å.

The dielectric layer 850 may be made of silicon oxide, silicon nitride, or silicon oxynitride, etc. In one embodiment, the dielectric layer 850 may be made of silicon oxide. The contact-hole plug 860 may be made of W, Al, Cu, Ag, or Au, etc. In one embodiment, the contact-hole plug 860 may be made of W.

Because the etching rate of the dielectric layer 850 may be larger than the etching rate of the sacrificial sidewall layer 930, during the process of funning, the contact-hole plug 860, the loss of the sacrificial sidewall layer 930 may be relatively small. Therefore, the sacrificial sidewall layer 930 may protect the sidewall structure 910, avoid the loss of the silicon oxide material of the sidewall structure 910 caused by the process of forming the contact-hole plug 860, and improve the electrical properties and reliability of the semiconductor structure.

In addition, the sacrificial sidewall layer 930 may have little impact on the electrical properties and reliability of the semiconductor structure, and have desired process compatibility.

Accordingly, the sacrificial sidewall layer may be formed on the side wait of the hard mask layer exposed by the first dielectric layer. The sacrificial sidewall layer may also be formed above the sidewall structure and the etching barrier layer. The sacrificial sidewall layer may be used as a mask to etch the second dielectric layer and the first dielectric layer, the etching rate of the second dielectric layer and the first dielectric layer may be larger than the etching rate of the sacrificial sidewall layer. During the etching process, the loss of the sacrificial sidewall layer may be relatively small, thus it may protect the sidewall structure, avoid the loss of the silicon oxide material in the top of the sidewall structure caused by the etching process, and improve the electrical properties and reliability of the semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A flash memory structure, comprising:
    a substrate;
    a gate structure formed on the substrate, wherein the gate structure includes a floating gate and a control gate formed on the floating gate;
    a hard mask layer formed on the control gate;
    a sidewall structure formed on at least part of side surface of the gate structure, wherein a top of the sidewall structure is higher than a top of the floating gate and lower than a top of the hard mask layer;
    an etching barrier layer formed on the sidewall structure;
    a sacrificial sidewall layer formed on a side wall of the hard mask layer exposed by the sidewall structure and above the sidewall structure and the etching barrier layer;
    a source region and a drain region formed in the substrate at both sides of the gate structure;
    a dielectric layer formed on the substrate between the adjacent gate structures, wherein a top of the dielectric layer is level with the top of the hard mask layer; and
    a contact-hole plug penetrating through the dielectric layer and connected to the source region and the drain region.

2. The flash memory structure according to claim 1, wherein the sidewall structure includes:
    a first silicon oxide layer;
    a silicon nitride layer formed on the first silicon oxide layer; and
    a second silicon oxide layer formed on the silicon nitride layer.

3. The flash memory structure according to claim 1, wherein:
    the etching barrier layer is made of silicon nitride.

4. The flash memory structure according to claim 1, wherein:
    a thickness of the etching barrier layer is in a range of approximately 10-300 Å.

5. The flash memory structure according to claim 1, wherein:
    the sacrificial sidewall layer is made of silicon nitride, silicon carbide, or silicon carbonitride.

6. The flash memory structure according to claim 1, wherein:
    a thickness of the sacrificial sidewall layer is in a range of 50-500 Å.

7. The flash memory structure according to claim 1, wherein:
    the gate structure includes: a gate layer on the substrate and the hard mask layer on the gate layer; and
    forming the gate structure by using the hard mask layer as a mask to etch the gate layer.

8. The flash memory structure according to claim 1, wherein:
    the dielectric layer includes: a first dielectric layer on the substrate and having a top is higher than a top of the floating gate and lower than a top of the hard mask layer, and a second dielectric layer on the first dielectric layer.

* * * * *